United States Patent
Yoshida et al.

(10) Patent No.: US 7,695,345 B2
(45) Date of Patent: Apr. 13, 2010

(54) POLISHING COMPOUND FOR SEMICONDUCTOR INTEGRATED CIRCUIT DEVICE, POLISHING METHOD AND METHOD FOR PRODUCING SEMICONDUCTOR INTEGRATED CIRCUIT DEVICE

(75) Inventors: Iori Yoshida, Yokohama (JP); Yoshinori Kon, Yokohama (JP)

(73) Assignees: Asahi Glass Company, Limited, Tokyo (JP); AGC Seimi Chemical Co., Ltd., Chigasaki (JP)

( * ) Notice: Subject to any disclaimer, the term of this patent is extended or adjusted under 35 U.S.C. 154(b) by 0 days.

(21) Appl. No.: 11/863,852

(22) Filed: Sep. 28, 2007

(65) Prior Publication Data
US 2008/0085663 A1  Apr. 10, 2008

Related U.S. Application Data

(63) Continuation of application No. PCT/JP2006/303648, filed on Feb. 27, 2006.

(30) Foreign Application Priority Data
Mar. 28, 2005 (JP) .............................. 2005-092608

(51) Int. Cl.
*B24B 1/00* (2006.01)
*H01L 21/302* (2006.01)

(52) U.S. Cl. ........................... 451/36; 51/308; 438/693; 451/41

(58) Field of Classification Search .................. 51/307, 51/309; 106/3; 438/690–694; 451/36, 41, 451/60
See application file for complete search history.

(56) References Cited

U.S. PATENT DOCUMENTS

| | | |
|---|---|---|
| 2003/0232159 A1 | 12/2003 | Pagilagan |
| 2004/0060502 A1* | 4/2004 | Singh .......................... 117/68 |
| 2004/0186206 A1* | 9/2004 | Yoneda et al. ................. 524/95 |
| 2005/0005525 A1* | 1/2005 | Li et al. ......................... 51/298 |

(Continued)

FOREIGN PATENT DOCUMENTS

JP  11-12561  1/1999

(Continued)

OTHER PUBLICATIONS

U.S. Appl. No. 11/951,540, filed Dec. 6, 2007, Kon, et al.

(Continued)

*Primary Examiner*—Timothy V Eley
(74) *Attorney, Agent, or Firm*—Oblon, Spivak, McClelland, Maier & Neustadt, L.L.P.

(57) ABSTRACT

To provide a technique employed when a plane to be polished of a silicon dioxide type material layer is polished in production of a semiconductor integrated circuit device, which is capable of polishing protruded portions by priority while suppressing polishing at recessed portions and planarizing the plane to be polished at a high level with an extremely small polishing amount, with small pattern dependence of the polishing rate. In production of a semiconductor integrated circuit device, when a plane to be polished is a plane to be polished of a silicon dioxide type material layer, a polishing compound containing cerium oxide particles, a water-soluble polyamine and water is used as a polishing compound for chemical mechanical polishing to polish the plane to be polished.

21 Claims, 4 Drawing Sheets

U.S. PATENT DOCUMENTS

| | | |
|---|---|---|
| 2005/0150173 A1* | 7/2005 | Vacassy ........................ 51/308 |
| 2006/0197054 A1* | 9/2006 | Akahori et al. ............ 252/79.1 |
| 2008/0035882 A1* | 2/2008 | Zhao et al. ................. 252/79.4 |
| 2008/0070412 A1* | 3/2008 | Yoshida et al. ............... 438/693 |

FOREIGN PATENT DOCUMENTS

| | | |
|---|---|---|
| JP | 2001-7061 | 1/2001 |
| JP | 2001-35818 | 2/2001 |
| JP | 2001-185514 | 7/2001 |
| JP | 3278532 | 2/2002 |
| JP | 2003-100752 | 4/2003 |
| JP | 2003-347247 | 12/2003 |
| JP | 2004-269577 | 9/2004 |
| JP | 2004-277474 | 10/2004 |
| JP | 2005-5501 | 1/2005 |
| JP | 2005-48122 | 2/2005 |
| JP | 2005-48125 | 2/2005 |

OTHER PUBLICATIONS

U.S. Appl. No. 11/856,166, filed Sep. 17, 2007, Yoshida, et al.
U.S. Appl. No. 12/401,747, Mar. 11, 2009, Kon, et al.
U.S. Appl. No. 12/403,864, filed Mar. 13, 2009, Kon, et al.

* cited by examiner

BEFORE POLISHING

AFTER POLISHING

BEFORE POLISHING

AFTER POLISHING

POLISHING COMPOUND FOR SEMICONDUCTOR INTEGRATED CIRCUIT DEVICE, POLISHING METHOD AND METHOD FOR PRODUCING SEMICONDUCTOR INTEGRATED CIRCUIT DEVICE

CROSS-REFERENCE TO RELATED APPLICATIONS

The present application is a continuation of International Patent Application PCT/JP2006/303648, filed on Feb. 27, 2006, which claims priority for Japanese Patent Application JP 2005-092608, filed on Mar. 28, 2005.

TECHNICAL FIELD

The present invention relates to a polishing technique to be utilized for production of a semiconductor integrated circuit device. More particularly, it relates to a polishing technique to be used in production of a semiconductor integrated circuit device including a silicon dioxide type material layer.

BACKGROUND ART

In recent years, development of miniaturization technique to achieve miniaturization and high densification is required along with high integration and high functionality of a semiconductor integrated circuit device. Particularly, importance of a planarization technique by chemical mechanical polishing (hereinafter referred to as CMP) has been increasing.

For example, along with miniaturization and multilayered structures of wiring of a semiconductor integrated circuit device, unevenness on the surface of each layer in production steps tends to be significant. In order to prevent such problems that the unevenness exceeds the depth of focus of photolithography, whereby no sufficient resolution will be obtained, CMP is an essential technique.

CMP is employed, specifically, for planarization of an interlevel dielectric (ILD) film, shallow trench isolation (STI), tungsten plug formation, formation of multilayered wiring comprising copper and a low dielectric film, etc. Further, it starts being applied to planarization of a premetal dielectric (PMD) film to be carried out prior to formation of metal wiring, for which a reflow process by heat treatment has been employed.

For an insulating film of e.g. ILD, STI and PMD, a silicon dioxide type is used in many cases. Heretofore, in production of a semiconductor device, for planarization of such a silicon dioxide type insulating film, silica abrasive particles have been commonly used as abrasive particles to be used for a CMP polishing compound.

On the surface of a film to be an object to be polished (hereinafter sometimes referred to as a film to be polished) in a semiconductor integrated circuit device, an uneven pattern is formed by the influence of unevenness of e.g. wiring beneath the film when it is laminated. When silica abrasive particles are applied to polishing of a silicon dioxide type film having such an uneven pattern, a sufficiently high polishing rate is obtained. However, there is a technical problem such that high level planarization is hardly realized by the following characteristics. That is, according to the degree of the pattern density of the surface unevenness (proportion of protruded pattern portions to the sum of the protruded pattern portions and recessed portions; for example, in the case of a stripe protruded pattern, the proportion of pattern widths to the sum of the pattern widths and pattern distances) and the protruded pattern size, the pattern dependence of the polishing rate at protruded portions is significant, and further, polishing is likely to proceed at a portion with a low density of protrusions and at a large size recessed portion (e.g. a portion over a wide portion between wirings). The polishing rate being influenced by the pattern density and the pattern size of the surface unevenness is called pattern dependence of the polishing rate.

Further, for planarization of a silicon dioxide type film by silica abrasive particles, the polishing amount required for planarization is large, and accordingly a film to be polished has to be formed with a large thickness in many cases, thus increasing the film formation cost and decreasing the throughput in production of a semiconductor integrated circuit device. For example, in PMD process, borophosphosilicate glass (BPSG), borosilicate glass (BSG), phosphosilicate glass (PSG), etc. with low hardness are used, and the polishing rate of such films are very high as compared with other materials. Therefore, such a film is preliminarily formed with a large thickness and then polished to realize planarization.

The above is exemplarily described with reference to FIG. 3. FIG. 3(a) is a partial cross-section illustrating a semiconductor integrated circuit device comprising a silicon substrate 1, and a silicon dioxide film 2, a polysilicon film 3 and a BPSG film 4 laminated on the substrate, which has a protruded portion 5 and a recessed portion 6 formed on the surface of the BPSG film 4 by the influence of the polysilicon film 3. This illustrates a state before polishing.

When the BPSG film face is polished in such a structure, the recessed portions of the BPSG film are also easily polished as compared with the protruded portions, and as a result, planarization of a plane is hardly realized to bring about a state shown in FIG. 3(b) in many cases. Therefore, at present, the BPSG film 4 is made large and polished so as to reduce unevenness.

As described above, a semiconductor integrated circuit device including a silicon dioxide type material layer, particularly, a semiconductor integrated circuit device including any one of a BPSG film, a BSG film and a PSG film, the polishing rates of which are commonly high as compared with another material, has a problem that planarization of a plane to be polished is hardly achieved.

In recent years, a CMP polishing compound using cerium oxide particles as abrasive particles has been studied. A cerium oxide polishing compound provides a high polishing rate by chemical reaction of cerium oxide with the SiO moiety on the surface of a plane to be polished, on the layer surface, and is expected to improve the throughput in production of a semiconductor device. A technique to improve dispersibility of the cerium oxide polishing compound and to improve flatness of a plane to be polished, by adding a surfactant, a water-soluble polymer, a water-soluble low molecular weight compound, etc. to the cerium oxide polishing compound, is now under development.

For example, Patent Document 1 proposes an organic compound having a hydrophilic group selected from a carboxyl group and a carboxylate group, as an additive suitable for planarization of an insulating film of e.g. $SiO_2$, SiON, SiOF, borophosphosilicate glass or phosphosilicate glass.

Further, Patent Document 2 discloses a low molecular weight additive selected from cationic water-soluble organic low molecular weight compound including a primary amine, a secondary amine, a tertiary amine and a quaternary ammonium compound, and discloses that in CMP technology to planarize an ILD film and an insulating film for STI, polishing can be carried out with high efficiency at a high rate and easily in view of process control.

Further, Patent Document 3 proposes to incorporate at least two additives of a water-soluble nitrogen-containing compound and a water-soluble anionic organic compound in a polishing compound, and discloses that such a polishing compound is a CMP polishing compound suitable for polishing of e.g. an ILD film and an insulating film for STI, which can planarize a plane to be polished at a high level at a high rate without scars, which is excellent in storage stability and with which process control is easy. The water-soluble nitrogen-containing compound is a primary amine, a secondary amine, a tertiary amine, a quaternary ammonium, polyvinyl pyrrolidone, N-alkyl-2-pyrrolidone, an aliphatic lactam or an aliphatic dicarboxylic acid imide. Further, the water-soluble anionic organic compound is a compound having a free —COOM group, a phenolic —OH group, a —SO$_3$M group, a —OSO$_3$M group, a —PO$_4$M$_2$ group or a —PO$_3$M$_2$ group (wherein M is a hydrogen atom, NH$_4$ or a metal atom).

However, these Patent Documents only disclose examples of polishing a silicon dioxide film, but failed to disclose a BPSG film, a BSG film and a PSG film which are difficult to planarize. The additive disclosed in Patent Document 1 is anionic and is thereby not adsorbed in a silicon dioxide film, a BPSG film, a BSG film and a PSG film which are negatively charged in water, whereby a covering layer can not sufficiently be formed. Even if it is possible to planarize a hard silicon dioxide film, the practical polishing rates of soft BPSG film, BSG film and PSG film are very high, and a semiconductor integrated circuit device having a pattern formed thereon can not be planarized. Further, the additive disclosed in Patent Document 2 is a cationic additive and is capable of forming a covering layer, but since it is a low molecular weight additive, the covering layer forming properties are insufficient, and a semiconductor integrated circuit device with a BPSG film, a BSG film and a PSG film can not be planarized either. Patent Document 3 proposes at least two additives of a water-soluble nitrogen-containing compound and a water-soluble anionic organic compound, but the water-soluble nitrogen-containing compound is substantially equal to the low molecular weight additive disclosed in Patent Document 2, and the polishing rates of a BPSG film, a BSG film and a PSG film are very high, and a semiconductor integrated circuit device can not be planarized either. Further, the pH of the CMP polishing compound is considered to be preferably from 3 to 9, more preferably from 7.0 to 9.0 in view of the stability, the selective polishing properties, workability, handling properties, etc. However, within this pH region, the polishing rates of a BPSG film, a BSG film and a PSG film can not effectively be controlled.

Patent Document 1: Japanese Patent No. 3278532
Patent Document 2: JP-A-2001-7061
Patent Document 3: JP-A-2001-185514
Patent Document 4: JP-A-11-12561
Patent Document 5: JP-A-2001-35818

DISCLOSURE OF THE INVENTION

Object to be Accomplished by the Invention

The object of the present invention is to solve the above problems and to provide a polishing compound and a polishing method capable of high level planarization, by polishing, at the time of polishing a plane to be polished of a silicon dioxide type material layer in production of a semiconductor integrated circuit device, protruded portions preferentially while suppressing polishing at recessed portions, with a very small pattern dependence of the polishing rate. Other objects and advantages of the present invention will be apparent from the following description.

Means to Accomplish the Object

Namely, the present invention provides the following.

(1) A polishing compound for chemical mechanical polishing, to polish a plane to be polished in production of a semiconductor integrated circuit device, wherein the plane to be polished is a plane to be polished of a silicon dioxide type material layer, and the polishing compound contains cerium oxide particles, a water-soluble polyamine and water.

(2) The polishing compound according to the above (1), wherein the silicon dioxide type material layer is a borophosphosilicate glass (BPSG) layer, a borosilicate glass (BSG) layer or a phosphosilicate glass (PSG) layer.

(3) The polishing compound according to the above (2), wherein the concentration of phosphorus, boron, or phosphorus and boron, in the silicon dioxide type material layer, is from 0.1 to 20 mass %.

(4) The polishing compound according to the above (1), wherein the silicon dioxide type material layer is a silicon dioxide layer.

(5) The polishing compound according to any one of the above (1) to (4), wherein the water-soluble polyamine is at least one water-soluble polyamine selected from the group consisting of a water-soluble polyether polyamine and a water-soluble polyalkylene polyamine.

(6) The polishing compound according to any one of the above (1) to (5), wherein the water-soluble polyamine has a weight average molecular weight of from 100 to 100,000.

(7) The polishing compound according to any one of the above (1) to (5), wherein the water-soluble polyamine has a weight average molecular weight of from 100 to 2,000.

(8) The polishing compound according to any one of the above (1) to (7), which contains the water-soluble polyamine in an amount of from 0.001 to 20 mass % based on the total mass of the polishing compound.

(9) The polishing compound according to any one of the above (1) to (7), which contains the water-soluble polyamine in an amount of from 0.05 to 5 mass % based on the total mass of the polishing compound.

(10) The polishing compound according to any one of the above (1) to (9), which has a pH within a range of from 9 to 12

(11) A method for polishing a plane to be polished, which comprises supplying a polishing compound to a polishing pad, and bringing a plane to be polished of a semiconductor integrated circuit device and the polishing pad into contact with each other to polish the plane to be polished by relative movement between them, wherein the plane to be polished is a plane to be polished of a silicon dioxide type material layer, and the polishing compound as defined in any one of the above (1) to (10) is used as the polishing compound.

(12) A method for producing a semiconductor integrated circuit device, which comprises a step of polishing a plane to be polished by the polishing method as defined in the above (11).

EFFECTS OF THE INVENTION

According to the present invention, at the time of polishing a plane to be polished of a silicon dioxide type material layer in production of a semiconductor integrated circuit device, the pattern dependence of the polishing rate is low, protruded portions can be polished preferentially while suppressing polishing at recessed portions, and a plane to be polished can be planarized at a high level with an extremely small polishing amount.

MEANINGS OF SYMBOLS

Figure 1A:
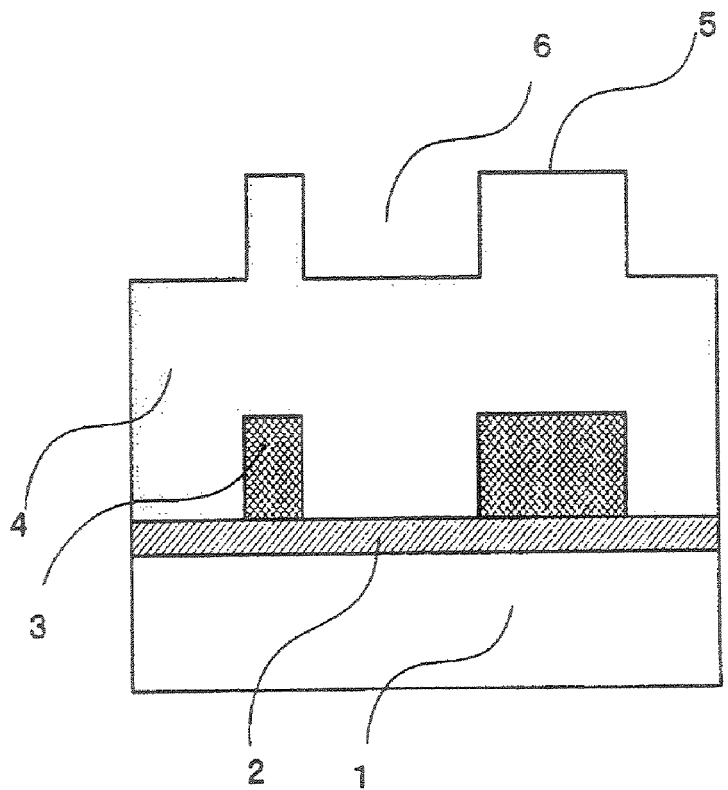
FIG. 1(a) is a side cross-section schematically illustrating a semiconductor device before being polished by a polishing composition in accordance with the present invention.

1: Silicon substrate, 2: silicon dioxide film, 3: polysilicon film, 4: BPSG film, 5: protruded portion, 6: recessed portion, 7: polished plane, 31: semiconductor device, 32: polishing head, 33: polishing platen, 34: polishing pad, 35: polishing compound supply piping, 36: polishing compound, 51: groove of silicon wafer, L: depth of groove of silicon wafer

BEST MODE FOR CARRYING OUT THE INVENTION

Now, embodiments of the present invention will be described with reference to drawings, Tables, formulas, Examples, etc. These drawings, Tables, formulas, Examples, etc. and description are to exemplify the present invention, and the present invention is not limited thereto. The present invention includes other embodiments within a range not to exceed the scope of the present invention. In the drawings, the same symbol designates the same constituent.

The polishing compound applicable to the present invention is a polishing compound for chemical mechanical polishing to polish a plane to be polished of a semiconductor integrated circuit device (hereinafter sometimes referred to simply as a semiconductor device), and contains cerium oxide particles, a water-soluble polyamine and water. It may further contain a dispersant. In the present invention, the "plane to be polished" means a surface at an intermediate stage which appears in the process of producing a semiconductor device.

By using this polishing compound, in a case where a semiconductor device comprises a silicon dioxide type material layer, in production thereof, a plane to be polished of the silicon dioxide type material layer can be polished, whereby a layer with a flat surface can easily be formed. Such a silicon dioxide type material layer may be contained at two or more portions in one semiconductor device.

Figure 1B:
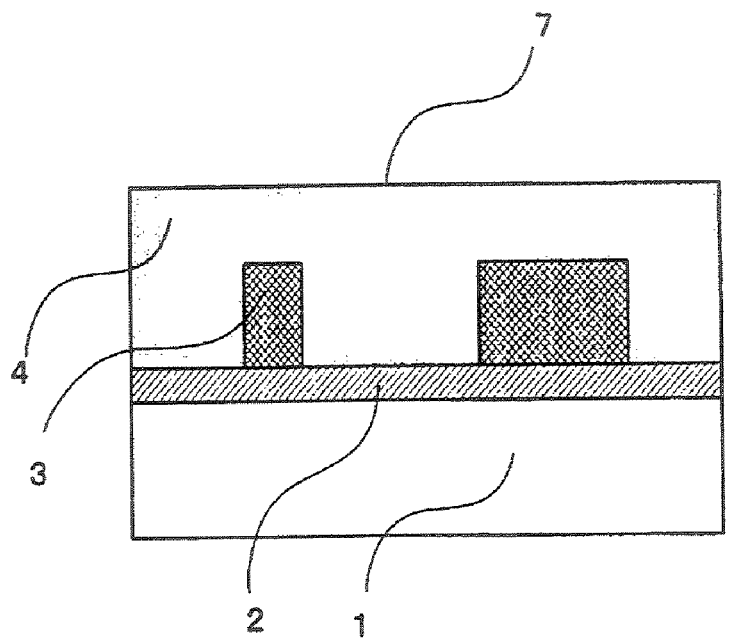
FIG. 1(b) is a side cross-section schematically illustrating a semiconductor device after being polished by a polishing composition in accordance with the present invention.
Figure 3A:
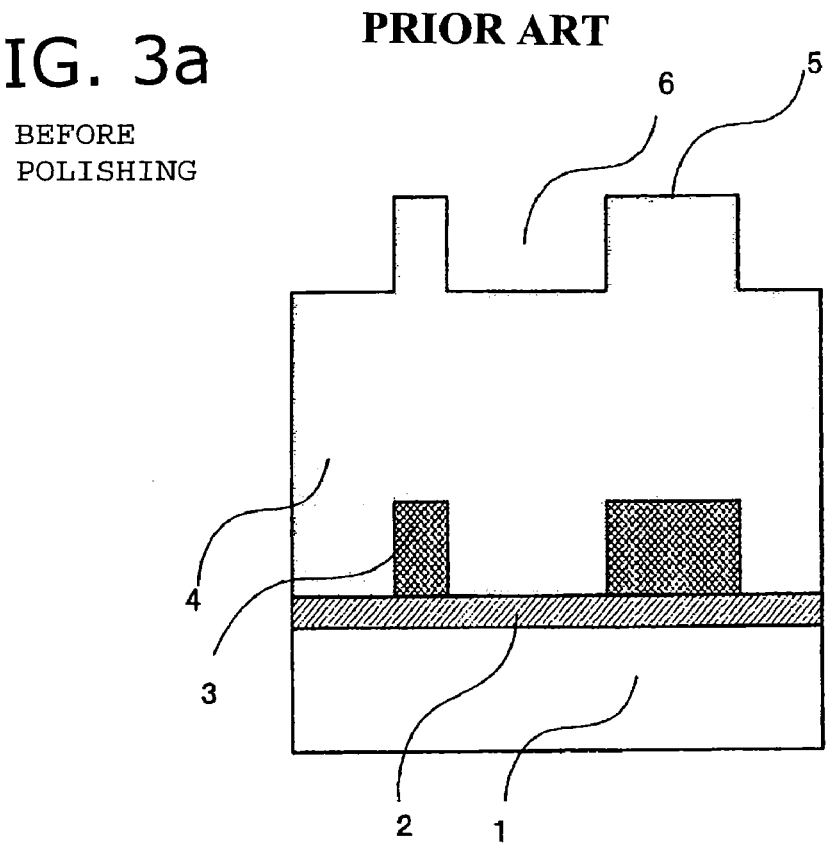
FIG. 3(a) is a side cross-section schematically illustrating a semiconductor device before being polished by a conventional polishing composition.
Figure 3B:
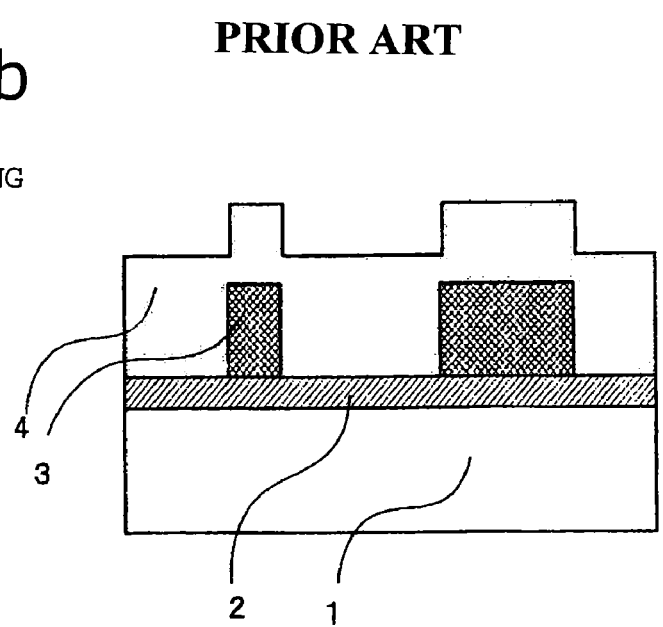
FIG. 3(b) is a side cross-section schematically illustrating a semiconductor device after being polished by a conventional polishing composition.

The above is exemplified in FIG. 1. FIG. 1(a) is a side cross-section schematically illustrating a semiconductor device having the same structure as in FIG. 3(a). When the polishing compound of the present invention is employed in such a case, the pattern dependence of the polishing rate when a plane to be polished of a silicon dioxide type material layer is polished is very small, whereby protruded portions can be polished preferentially while suppressing progress of polishing at recessed portions, whereby high level planarization of unevenness on the plane to be polished can be realized with a small polishing amount as shown in FIG. 1(b). That is, high level planarization of unevenness on the plane to be polished can be realized by polishing the film in a small amount as schematically shown by the thickness of the BPSG film in FIG. 3(a) and the thickness of the BPSG film in FIG. 1(a). In addition, the polished plane 7 is very flat, and it is easy to make the remaining film thick. In such a manner, reduction of the film formation cost and improvement of the throughput are possible in production of a semiconductor integrated circuit device. Further, the present polishing compound is free from agglomeration of abrasive particles and is thereby excellent in dispersion stability and is advantageous against polishing defects.

In the present invention, cerium oxide is used as abrasive particles in the polishing compound. Heretofore, cerium oxide abrasive particles have been known to provide a specifically high polishing rate in polishing of a silicon dioxide type material. This is because contact of cerium oxide with the SiO moiety on the surface of the film to be polished causes chemical linkage therebetween, thus generating abrasive power more than mere mechanical action.

Therefore, in polishing using cerium oxide, control of contact of the abrasive particles with an object to be polished is important.

As the cerium oxide abrasive particles in the present invention, for example, cerium oxide abrasive particles as disclosed in Patent Document 4 or 5 can be preferably used. That is, a cerium oxide powder obtained by adding an alkali to a cerium(IV) ammonium nitrate aqueous solution to prepare a cerium hydroxide gel, followed by filtration, washing and firing, can be preferably used. Further, cerium oxide abrasive particles obtained by milling high purity cerium carbonate and firing it, followed by milling and classification, may also be preferably used. However, the cerium oxide abrasive particles are not particularly limited thereto.

The average particle size (diameter) of the cerium oxide abrasive particles is preferably from 0.01 to 0.5 μm, particularly preferably from 0.02 to 0.3 μm, more preferably from 0.05 to 0.2 μm, in view of polishing properties and dispersion stability. If the average particle size is too large, polishing defects such as scratches are likely to form on the surface of the semiconductor substrate. If the average particle size is too small, the polishing rate may be low. Further, since the ratio of the surface area per unit volume is high, the cerium oxide abrasive particles are likely to be influenced by the surface state. Depending on conditions such as the pH and the concentration of additives, the abrasive particles are likely to agglomerate in some cases. If agglomeration takes place, polishing defects such as scratches are likely to form on the surface of the semiconductor substrate.

The silicon dioxide type material in the present invention is generally a material having another element incorporated to silicon dioxide. Incorporation here means that another element is uniformly contained. In such a case, "another element", may be any optional element. It may, for example, boron, phosphorus, carbon, nitrogen or fluorine.

When the silicon dioxide type material in the present invention contains at least one of boron and phosphorus, the polishing rate significantly varies depending upon their contents, whereby the effects of the present invention are likely to be achieved. In the case of a silicon dioxide type material containing phosphorus, boron, or phosphorus and boron, high effects will be obtained when the concentration of phosphorus, boron, or phosphorus and boron in the silicon dioxide type material is within a range of from 0.1 to 20 mass %. The silicon dioxide type material containing phosphorus, boron, or phosphorus and boron, can be formed by $SiO_2$—CVD (chemical vapor deposition) by adding an inorganic gas such as $B_2H_6$ (diborane) or $PH_3$ (phosphine) or an organic gas such as $B(OCH_3)_3$ (trimethoxyborane) or $P(OCH_3)_3$ (trimethoxyphosphoine) simultaneously to $SiH_4$ (silane) and $O_2$ as a raw material gas.

Well known as a silicon dioxide type material containing phosphorus, boron, or phosphorus and boron, is borophosphosilicate glass (BPSG), borosilicate glass (BSG) or phosphosilicate glass (PSG), and when such a material is used, the present invention is particularly effective. This is considered to be by an effect of adsorption of a water-soluble polyamine on the surface of the cerium oxide abrasive particles and on the plane to be polished. Namely, by such an effect, at recessed portions at which the polishing pressure is low, chemical reaction is inhibited by the contact between cerium oxide and the SiO moiety in the plane to be polished, whereby progress of polishing is suppressed, and at protruded portions at which the polishing pressure is high, the water-soluble polyamine such as polyoxypropylene diamine adsorbed is easily peeled off, whereby polishing proceeds preferentially, and thus high level planarization on the plane to be polished becomes possible.

BPSG is glass containing silicon, phosphorus, boron and oxygen as the main components. The contents of phosphorus and boron are variable within a range of from 0.1 to 20 mass %, respectively. BSG is glass containing silicon, boron and oxygen as the main components. The boron content is variable within a range of from 0.1 to 20 mass %. Further, PSG is glass containing silicon, phosphorus and oxygen as the main components. The phosphorus content is variable within a range of from 0.1 to 20 mass %.

Here, the silicon dioxide type material in the present invention includes silicon dioxide itself. Namely, the present invention is useful also when the plane to be polished is a plane of a silicon dioxide layer. In such a case, polishing is possible by lowering the water-soluble polyamine concentration.

The water-soluble polyamine in the polishing compound is not limited so long as it is a water-soluble compound having at least two amino groups in one molecule. Water-solubility may be of any degree so long as the water-soluble polyamine is completely dissolved, as visually observed, in a polishing compound liquid at a concentration at which the liquid is used as a polishing compound. Usually, water-solubility means that at least 1 mass %, preferably at least 5 mass % of the water-soluble polyamine is dissolved in pure water. Specifically, preferred is at least one material selected from the group consisting of water-soluble polyether polyamine, water-soluble polyalkylene polyamine, polyethyleneimine, water-soluble polyvinylamine, water-soluble polyallylamine, water-soluble polylysine and water-soluble chitosan. A particularly preferred water-soluble polyamine is a water-soluble polyether polyamine or a water-soluble polyalkylene polyamine.

The molecular weight of the water-soluble polyamine is not particularly limited so long as the polyamine is water-soluble, but it is preferably from 100 to 100,000, more preferably from 100 to 2,000, by the weight average molecular weight. If the weight average molecular weight is less than 100, the effect of the water-soluble polyamine tends to be small. If it exceeds 100,000, even though the polyamine is water-soluble, it may adversely affect properties of the polishing compound such as fluidity. If the weight average molecular weight exceeds 2,000, solubility in pure water decreases in many cases. A particularly preferred water-soluble polyamine is a water-soluble polyether polyamine or a water-soluble polyalkylene polyamine, having a weight average molecular weight of from 100 to 2,000.

Such a water-soluble polyamine is highly effective for suppression of the polishing rate of the silicon dioxide type material layer. Particularly when the silicon dioxide type material contains phosphorus, boron, or phosphorus and boron, it is effective for suppression of the polishing rate thereof. Since such an insulating film has low hardness, with an usual polishing compound with silica abrasive particles or a polishing compound with conventional cerium oxide abrasive particles, the polishing rate is remarkably high, the pattern dependence is significant, and the polishing proceeds fast at recessed portions, whereby a large polishing amount is required and high level planarization can not sufficiently be realized.

Whereas, with a water-soluble polyamine, the polishing rate can significantly be reduced by suppressing the polishing rate of the silicon dioxide type material layer, the pattern dependence is very low, and protruded portions can be polished preferentially while suppressing progress of polishing at recessed portions, whereby high level planarization can be realized.

A particularly preferred water-soluble polyamine in the present invention is at least one water-soluble polyamine selected from the group consisting of a water-soluble polyether polyamine having a weight average molecular weight of from 100 to 2,000 and a water-soluble polyalkylene polyamine having a weight average molecular weight of from 100 to 2,000. From the viewpoint of high effect of stabilizing dispersion of the cerium oxide abrasive particles, the weight average molecular weight of the water-soluble polyether polyamine is more preferably from 150 to 800, furthermore preferably from 150 to 400.

The above polyether polyamine is a compound having at least two amino groups and at least two etheric oxygen atoms. The amino group is preferably a primary amino group (—$NH_2$). The polyether polyamine may have a secondary amino group (—NH—) or a tertiary amino group as amino groups, but the polyether polyamine in the present invention is preferably a compound having at least two primary amino groups and having substantially no other amino groups, particularly preferably a polyether diamine having two primary amino groups alone. The polyether polyamine is preferably a compound having such a structure that a hydrogen atom of a hydroxyl group in a polyhydric alcohol or a polyether polyol is substituted by an aminoalkyl group. The polyhydric alcohol is preferably a dihydric to hexahydric alcohol, particularly preferably a dihydric alcohol, and the polyether polyol is preferably a dihydric to hexahydric polyoxyalkylene polyol, particularly preferably a polyoxyalkylene diol. The aminoalkyl group is preferably a $C_{2-6}$ aminoalkyl group such as a 2-aminoethyl group, a 2-aminopropyl group, a 2-amino-1-methylethyl group, a 3-aminopropyl group, a 2-amino-1,1-dimethylethyl group or a 4-aminobutyl group.

The polyhydric alcohol is preferably a $C_{2-8}$ dihydric alcohol which may have an etheric oxygen atom, such as ethylene glycol, diethylene glycol, propylene glycol or dipropylene glycol. The polyether polyol is preferably a polyether diol of which the repeating unit is a $C_{2-6}$ oxyalkylene group, such as a polyethylene glycol (i.e. polyoxyethylene diol) such as triethylene glycol or tetraethylene glycol, a polypropylene glycol (i.e. polyoxypropylene diol) such as tripropylene glycol or tetrapropylene glycol, or a polyoxyalkylene diol having at least two types of oxyalkylene groups, such as poly(oxypropylene/oxyethylene)diol.

The polyalkylene polyamine is a compound having at least three amino groups bonded via an alkylene group. Preferably, the terminal amino group is a primary amino group and the amino group in the interior of the molecule is a secondary amino group. More preferred is a chain polyalkylene polyamine having a primary amino group at both molecular terminals and having at least one secondary amino group in the interior of the molecule. At least two bonding moieties consisting of an alkylene group, sandwiched between an amino group and another amino group, exist in one molecule, and such a plurality of bonding moieties between amino groups may be the same or different. Preferably, all these moieties are the same, or two bonding moieties between amino groups bonded to the primary amino group at both terminals are the same and the other bonding moiety between amino groups is different. One bonding moiety between amino groups preferably has from 2 to 8 carbon atoms, particularly preferably each of the two bonding moieties between amino groups bonded to the primary amino group at both terminals has from 2 to 8 carbon atoms and the other bonding moiety between amino groups has from 2 to 6 carbon atoms.

Each of the polyether diamine and the polyalkylene polyamine is preferably a compound having a structure of the following formula (1):

$$H_2N-(R-X-)_k-R-NH_2 \quad (1)$$

wherein R is a $C_{2-8}$ alkylene group, X is an oxygen atom or —NH—, and k is an integer of at least 2 in the case of a polyether diamine or an integer of at least 1 in the case of a polyalkylene polyamine, provided that a plurality of R's in one molecule may be different.

Particularly, the polyether diamine is preferably a compound having a structure of the following formula (2), and the polyalkylene polyamine is preferably a compound having a structure of the following formula (3):

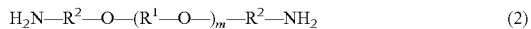

$$H_2N-R^2-O-(R^1-O-)_m-R^2-NH_2 \quad (2)$$

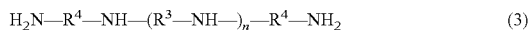

$$H_2N-R^4-NH-(R^3-NH-)_n-R^4-NH_2 \quad (3)$$

wherein $R^1$ is an ethylene group or a propylene group, $R^2$ is a $C_{2-6}$ alkylene group, $R^3$ is a $C_{2-6}$ alkylene group, $R^4$ is a $C_{2-8}$ alkylene group, m is an integer of at least 1, and n is an integer of at least 1, provided that $R^1$ and $R^2$ may be the same or different, and $R^3$ and $R^4$ may be the same or different.

Specifically, the polyether diamine of the formula (2) may, for example, be a polyoxypropylene diamine (a compound wherein $R^1$ and $R^2$ are propylene groups and m is at least 1), polyoxyethylene diamine (a compound wherein $R^1$ and $R^2$ are ethylene groups and m is at least 1), or 4,7,10-trioxatridecane-1,13-diamine (a compound wherein $R^1$ is an ethylene group, $R^2$ is a trimethylene group and m is 2). Specifically, the polyalkylene polyamine of the formula (3) may, for example, be tetraethylenepentamine (a compound wherein $R^3$ and $R^4$ are ethylene groups and n is 2), pentaethylenehexamine (a compound wherein $R^3$ and $R^4$ are ethylene groups and n is 3), heptaethyleneoctamine (a compound wherein $R^3$ and $R^4$ are ethylene groups and n is 5), N,N'-bis(3-aminopropyl)-ethylenediamine (a compound wherein $R^3$ is an ethylene group, $R^4$ is a trimethylene group and n is 1), or N,N'-bis(2-aminoethyl)-1,4-butanediamine (a compound wherein $R^3$ is a tetramethylene group, $R^4$ is an ethylene group and n is 1).

The concentration of the water-soluble polyamine in the polishing compound is preferably set properly within a range of from 0.001 to 20 mass %, considering the polishing rate, uniformity of a polishing compound mixture, the weight average molecular weight of the water-soluble polyamine, etc., with a view to obtaining sufficient effects of suppressing the polishing rate. The concentration of the water-soluble polyamine in the polishing compound is more preferably within a range of from 0.05 to 5 mass %. In a case where the plane to be polished is a plane of a silicon dioxide layer, the concentration of the water-soluble polyamine is more preferably within a range of from 0.05 to 2 mass %.

The water in the present invention is not particularly limited, but preferred is pure water, ultrapure water, deionized water, etc. in view of influences over the other components, inclusion of impurities, influences on the pH, etc.

The present polishing compound can be used within an alkaline pH region. Considering the polishing properties and dispersion stability of the polishing compound, it is used preferably at a pH of from 9 to 12. If the pH is less than 9, the dispersibility may decrease, and if it exceeds 12, although the polishing properties will not be impaired, the plane to be polished may be affected, or handling properties may be impaired.

In the polishing compound of the present invention, another component may coexist. As a typical example, a dispersant may be mentioned. The dispersant may be a water-soluble organic polymer or an anionic surfactant. The water-soluble organic polymer is preferably a polymer having a carboxylic acid group, a carboxylic acid ammonium salt or the like.

The polishing compound of the present invention is not necessarily subjected to polishing as a mixture of all the polishing materials constituting the polishing compound. The polishing materials may be mixed to have a composition of the polishing compound when subjected to polishing. For example, a liquid 1 containing cerium oxide particles and water, and optionally a dispersant, and a liquid 2 containing a water-soluble polyamine, are separately prepared and properly mixed at the time of polishing with the mixture ratio adjusted. This method is useful when it is necessary to adjust the polishing rate depending upon the concentration of boron or phosphorus in the silicon dioxide type material layer.

When a semiconductor substrate is polished by using the polishing compound of the present invention, the polishing compound is supplied to a polishing pad, and a plane to be polished of a semiconductor device and the polishing pad are brought into contact with each other to polish the plane to be polished of a silicon dioxide material layer by relative movement between them. The conditions regarding the silicon dioxide type material are the same as described in relation to the polishing compound of the present invention.

Figure 2:
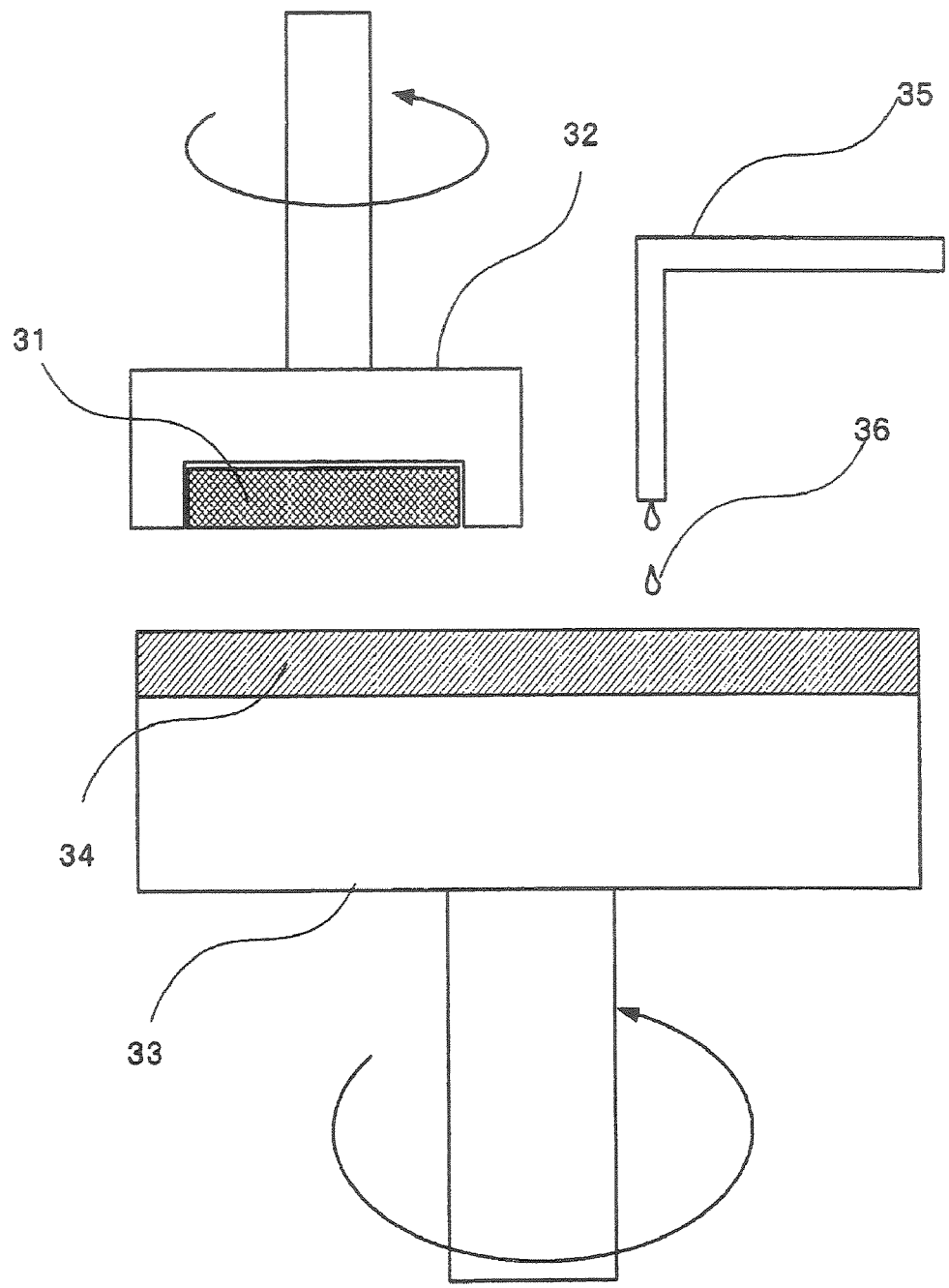
FIG. 2 is a drawing illustrating one example of a polishing apparatus applicable to the polishing method of the present invention.

As a polishing apparatus, a common polishing apparatus may be used. For example, FIG. 2 is a drawing illustrating one example of a polishing apparatus applicable to the polishing method of the present invention. It employs a method of holding a semiconductor device 31 in a polishing head 32 and bringing it into contact with a polishing pad 34 bonded to the surface of a polishing platen 33, and rotating the polishing head 32 and the polishing platen 33 to bring relative movement, while supplying a polishing compound 36 from a polishing compound supply piping 35. However, the polishing apparatus in the present invention is not limited thereto.

The polishing head 32 does not only rotate but also move linearly. The polishing platen 33 and the polishing pad 34 may have the same size as the semiconductor device 31 or smaller. In such a case, preferably the polishing head 32 and the polishing platen 33 are relatively moved so that the entire surface of the semiconductor device can be polished. The polishing platen 33 and the polishing pad 34 may not be rotary type but may be of a belt type and move in one direction.

The polishing conditions of the polishing apparatus are not particularly limited, but the polishing rate can be improved by applying a load to the polishing head 32 and pressing the polishing head 32 against the polishing pad 34. The polishing pressure is preferably from about 0.5 to about 50 kPa, and it is particularly preferably from about 3 to about 40 kPa from the viewpoint of uniformity of the polishing rate in a semiconductor device, flatness, and prevention of polishing defects such as scratches. Further, the number of revolutions of the polishing platen and the polishing head is preferably from about 50 to about 500 rpm, but is not limited thereto.

As the polishing pad, common one made of e.g. a non-woven fabric, a polyurethane foam, a porous resin or a non-porous resin can be used. Further, on the surface of the polishing pad, e.g. lattice, concentric or spiral grooves may be formed so as to accelerate supply of the polishing compound or to make a certain amount of the polishing compound stay.

As mentioned above, by polishing using the polishing compound of the present invention, high level planarization of unevenness on a plane to be polished of a silicon dioxide type material layer can be realized with a small amount of polishing. The surface after polishing is very flat, and it is easy to make the remaining film thick. The cost reduction and improvement of the throughput of film formation are possible. Accordingly, in production of a semiconductor device using the present polishing method, it is possible to improve the quality, to reduce the cost and to improve the throughput. The present invention is suitable particularly for a semiconductor device employing ILD, STI and PMD.

EXAMPLES

Now, the present invention will be described in further detail with reference to Examples. Examples 1 to 11 and 14 are Examples of the present invention, and Examples 12 and 13 are Comparative Examples. In Examples, "%" means mass % unless otherwise specified. Properties were evaluated by the following methods.

(pH)

Measured by pH81-11 manufactured by Yokogawa Electric Corporation.

(Average Particle Size of Abrasive Particles)

Determined by a laser scattering/diffraction apparatus (tradename: LA-920, manufactured by Horiba, Ltd.)

(Dispersion Stability of Polishing Compound)

The "coagulation sedimentation time" in Examples was determined as a time until 20 mL of a polishing compound put in a glass test tube with a diameter of 18 mm left at rest for ten days was separated into two layers to form a supernatant liquid.

(Polishing Properties)

(1) Polishing Conditions

Polishing was carried out by the following apparatus under the following conditions.

Polishing machine: Automatic CMP machine MIRRA (manufactured by Applied Materials, Inc.)

Polishing compound supply rate: 200 mL/minute

Polishing pad: Two-layer pad IC-1400 K-Groove or single layer pad IC-1000 K-Groove (manufactured by Rodel, Inc.)

Polishing pad conditioning: MEC100-PH3.5L (manufactured by Mitsubishi Materials Corporation)

Speed of revolutions of polishing platen: 77 rpm

Speed of revolutions of polishing head: 73 rpm

Polishing pressure: 27.6 kPa (in the case of polishing compounds in Examples 1 to 11 and 14)

Polishing pressure: 13.8 kPa (in the case of polishing compounds in Examples 12 and 13)

(2) Evaluation

Measurement of polishing rate: Film thickness meter UV-1280SE (manufactured by KLA-Tencor) was used.

Measurement of difference in level on the surface: Profiler HRP-100 (manufactured by KLA-Tencor) was used.

(3) Object to be Polished

The following objects to be polished were used.

(3-1) Blanket Wafer

With respect to polishing compounds in Examples 1 to 4, 8 and 11 to 13, a blanket wafer, a silicon plane of which was entirely covered with a BPSG film (1 μm thickness) with boron and phosphorus concentrations of 3.52% and 3.85%, respectively, manufactured by International SEMATECH, was used.

With respect to polishing compounds in Examples 5 to 7, 12 and 13, a blanket wafer, a silicon plane of which was entirely covered with a BPSG film (1 μm thickness) with boron and phosphorus concentrations of 13% and 14%, respectively, manufactured by International SEMATECH, was used.

Figure 4:
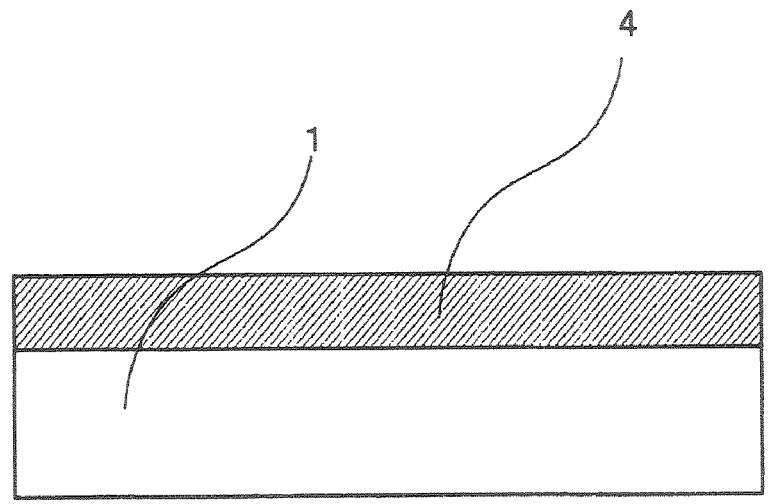
FIG. 4 is a side cross-section schematically illustrating a blanket wafer.

A side cross-section schematically illustrating the blanket wafer is shown in FIG. 4.

(3-2) Patterned Wafer

Figure 5:
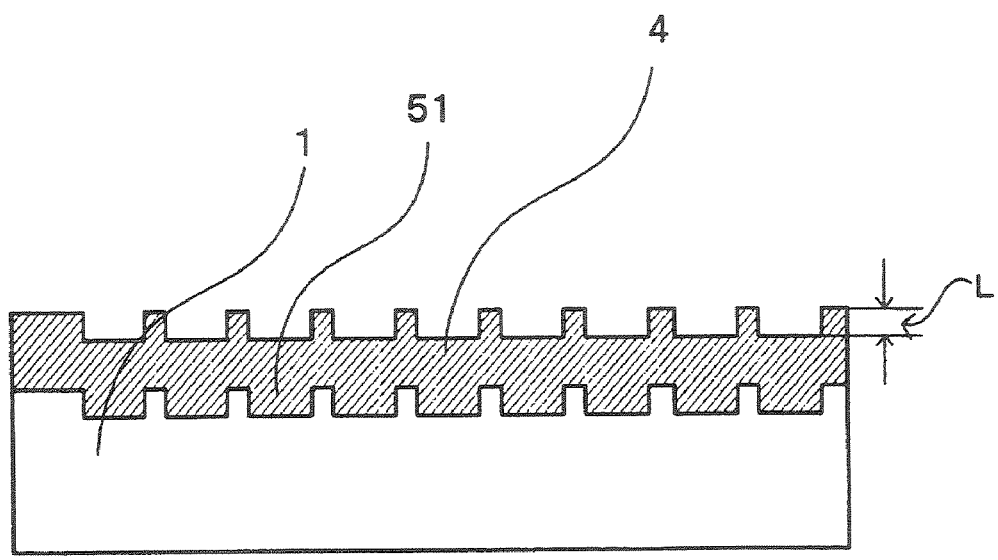
FIG. 5 is a side cross-section schematically illustrating a patterned wafer.

With respect to polishing compounds in Examples 1 to 4 and 8 to 12, a patterned wafer, a silicon plane of which was entirely covered with a STI864CMP000 BPSG film (boron: 3.52%, phosphorus: 3.85%) (1 μm thickness), the silicon plane having stripe-patterned grooves with a pattern width of 100 μm and a pattern interval of 10 μm. With respect to a polishing compound in Example 5, the wafer was same as in the case of polishing compounds in Examples 1 to 4 and 12 except that the boron concentration was 13% and the phosphorus concentration was 14% in the STI864CMP000 BPSG film. This pattern is a pattern imitating STI. A side cross-section schematically illustrating the patterned wafer is shown in FIG. 5. The symbol 51 represents a groove of a silicon wafer.

The difference in level on the surface of each of the patterned wafers used in Examples 1 to 5 and 8 to 12, i.e. the depth of the pattern groove (corresponding to L in FIG. 5) was 350 nm, but the present invention is not limited to this value.

With respect to a polishing compound in Example 14 (the same polishing compound as in Example 1), such a patterned wafer was used that protruded portions on a silicon plane of STI864CMP000 having the same stripe-patterned grooves as in the case of the polishing compounds in Examples 1 to 4 and 12, were sequentially covered with a silicon dioxide film (10 nm thickness) and a silicon nitride film (140 nm thickness), and such a silicon plane was entirely covered with a silicon dioxide film (700 nm thickness). The difference in level of the patterned wafer used in Example 14 i.e. the depth of the pattern groove was 500 nm.

(4) Method of Evaluating Properties of Polishing Compound

The blanket wafer was polished for 60 seconds, and the difference in thickness between before and after the polishing was regarded as the polishing rate.

Regarding the patterned wafer, data of the thickness at a protruded portion and the thickness at a recessed portion at density patterns of 10%, 20%, 30%, 40% and 50% in one chip were measured before and after the polishing with respect to one point at a center portion of each density pattern, and these data were regarded as values at the respective densities. The variation of the thickness at the protruded portion is a difference between the maximum and the minimum of the difference in the thickness at the protruded portion at each density before and after the polishing. The maximum polishing amount at the recessed portion is the maximum difference in the thickness at the recessed portion at each density before and after the polishing. The maximum difference in level is the greatest value among differences in level between the protruded portion and the recessed portion at each density after the polishing. For measurement of the thickness, optical interference type automatic thickness measuring apparatus UV1280SE (manufactured by KLA Tencor) was used.

The value regarding the density means, in the case of 10% for example, the proportion of the width of the pattern at the protruded portion to the sum of the width of the pattern at the protruded portion and the width of the pattern at the recessed portion, when the patterned wafer is observed from the direction at right angles to the plane.

Example 1

Cerium oxide abrasive particles and ammonium polyacrylate having a weight average molecular weight of 5,000 as a dispersant were mixed in a mass ratio of 100:0.7 in deionized water with stirring, followed by ultrasonic dispersion and filtering to prepare a mixture having a concentration of abrasive particles of 10% and a dispersant concentration of 0.07%. This mixture was diluted five times with deionized water to prepare an abrasive particle mixture A having an abrasive particle concentration of 2% and a dispersant concentration of 0.014%. The pH of the abrasive particle mixture A was 7.6, and the average particle size of the abrasive particles was 0.19 μm.

Then, in deionized water, a polyoxypropylene diamine (tradename, polyetheramine, manufactured by BASF) having a weight average molecular weight of 230 as a water-soluble polyamine was dissolved to prepare an additive liquid B having a polyoxypropylene diamine concentration of 1.0%.

The additive liquid B and the abrasive particle mixture A in a mass ratio of 1:1 were mixed with stirring to prepare a polishing compound having an abrasive particle concentration of 1%, an ammonium polyacrylate concentration of 0.007%, a polyoxypropylene diamine concentration of 0.5% and a pH of 10.8.

Example 2

An additive liquid C was prepared in the same manner as in preparation of the additive liquid B in Example 1 except that the concentration of the polyoxypropylene diamine was 2.0%. This additive liquid C and an abrasive particle mixture A prepared in the same manner as in Example 1 in a mass ratio of 1:1 were mixed with stirring to prepare a polishing compound having an abrasive particle concentration of 1%, an ammonium polyacrylate concentration of 0.007%, a polyoxypropylene diamine concentration of 1.0% and a pH of 11.2.

Example 3

An additive liquid D was prepared in the same manner as in preparation of the additive liquid B in Example 1 except that the concentration of the polyoxypropylene diamine was 2.5%. This additive liquid D and an abrasive particle mixture A prepared in the same manner as in Example 1 in a mass ratio of 1:1 were mixed with stirring to prepare a polishing compound having an abrasive particle concentration of 1%, an ammonium polyacrylate concentration of 0.007%, a polyoxypropylene diamine concentration of 1.25% and a pH of 11.3.

Example 4

An additive liquid E was prepared in the same manner as in preparation of the additive liquid B in Example 1 except that the concentration of the polyoxypropylene diamine was 3.0%. This additive liquid E and an abrasive particle mixture A prepared in the same manner as in Example 1 in a mass ratio of 1:1 were mixed with stirring to prepare a polishing compound having an abrasive particle concentration of 1%, an ammonium polyacrylate concentration of 0.007%, a polyoxypropylene diamine concentration of 1.5% and a pH of 11.4.

Example 5

An additive liquid F was prepared in the same manner as in preparation of the additive liquid B in Example 1 except that a polyoxypropylene diamine (tradename: polyetheramine, manufactured by BASF) having a weight average molecular weight of 400 was used and that the polyoxypropylene diamine concentration was 1.0%. This additive liquid F and an abrasive particle mixture A prepared in the same manner as in Example 1 in a mass ratio of 1:1 were mixed with stirring to prepare a polishing compound having an abrasive particle concentration of 1%, an ammonium polyacrylate concentration of 0.007%, a polyoxypropylene diamine concentration of 0.5% and a pH of 10.9.

Example 6

An additive liquid G was prepared in the same manner as in preparation of the additive liquid F in Example 5 except that the concentration of the polyoxypropylene diamine was 2.0%. This additive liquid G and an abrasive particle mixture A prepared in the same manner as in Example 1 in a mass ratio of 1:1 were mixed with stirring to prepare a polishing compound having an abrasive particle concentration of 1%, an ammonium polyacrylate concentration of 0.007%, a polyoxypropylene diamine concentration of 1.0% and a pH of 11.1.

Example 7

An additive liquid H was prepared in the same manner as in preparation of the additive liquid B in Example 1 except that a polyoxypropylene diamine (tradename: polyetheramine, manufactured by BASF) having a weight average molecular weight of 440 was used and that the polyoxypropylene diamine concentration was 1.0%. This additive liquid H and an abrasive particle mixture A prepared in the same manner as in Example 1 in a mass ratio of 1:1 were mixed with stirring to prepare a polishing compound having an abrasive particle concentration of 1%, an ammonium polyacrylate concentration of 0.007%, a polyoxypropylene diamine concentration of 0.5% and a pH of 10.9.

Example 8

An additive liquid I was prepared in the same manner as in preparation of the additive liquid B in Example 1 except that 4,7,10-trioxamidecane-1,13-diamine (manufactured by BASF) having a weight average molecular weight of 220 was used and that the concentration of the 4,7,10-trioxamidecane-1,13-diamine was 0.5%. This additive liquid I and an abrasive particle mixture A prepared in the same manner as in Example 1 in a mass ratio of 1:1 were mixed with stirring to prepare a polishing compound having an abrasive particle concentration of 1%, an ammonium polyacrylate concentration of 0.007%, a 4,7,10-trioxamidecane-1,13-diamine concentration of 0.25% and a pH of 10.7.

Example 9

An additive liquid J was prepared in the same manner as in preparation of the additive liquid I in Example 8 except that the concentration of the 4,7,10-trioxamidecane-1,13-diamine was 0.3%. This additive liquid J and an abrasive particle mixture A prepared in the same manner as in Example 1 in a mass ratio of 1:1 were mixed with stirring to prepare a polishing compound having an abrasive particle concentration of 1%, an ammonium polyacrylate concentration of 0.007%, a 4,7,10-trioxamidecane-1,13-diamine concentration of 0.15% and a pH of 10.6.

Example 10

An additive liquid K was prepared in the same manner as in preparation of the additive liquid B in Example 1 except that N,N'-bis(3-aminopropyl)-ethylenediamine (manufactured by BASF) having a weight average molecular weight of 220 was used and that the concentration of the N,N'-bis(3-aminopropyl)-ethylenediamine was 0.4%. This additive liquid K and an abrasive particle mixture A prepared in the same manner as in Example 1 in a mass ratio of 1:1 were mixed with stirring to prepare a polishing compound having an abrasive particle concentration of 1%, an ammonium polyacrylate concentration of 0.007%, a N,N'-bis(3-aminopropyl)-ethylenediamine concentration of 0.2% and a pH of 11.3.

Example 11

An additive liquid L was prepared in the same manner as in preparation of the additive liquid B in Example 1 except that pentaethylenehexamine (manufactured by Wako Pure Chemical Industries, LTD.) having a weight average molecular weight of 232 was used and that the concentration of the pentaethylenehexamine was 0.2%. This additive liquid L and an abrasive particle mixture A prepared in the same manner as in Example 1 in a mass ratio of 1:1 were mixed with stirring to prepare a polishing compound having an abrasive particle concentration of 1%, an ammonium polyacrylate concentration of 0.007%, a pentaethylenehexamine concentration of 0.1% and a pH of 11.2.

Example 12

To deionized water, an aqueous nitric acid solution for pH adjustment and ammonium polyacrylate having a weight average molecular weight of 5,000 were added to prepare an additive liquid M having a nitric acid concentration of 0.292% and an ammonium polyacrylate concentration of 0.68%.

This additive liquid M and an abrasive particle mixture A prepared in the same manner as in Example 1 in a mass ratio of 1:1 were mixed with stirring to prepare a polishing compound having an abrasive particle concentration of 1%, a concentration of the ammonium polyacrylate from the abrasive particle mixture A of 0.007%, a concentration of the ammonium polyacrylate from the additive liquid M of 0.34% and a pH of 5.0.

Example 13

To deionized water, an aqueous nitric acid solution for pH adjustment and ammonium polyacrylate having a weight average molecular weight of 5,000 were added to prepare an additive liquid N having a nitric acid concentration of 0.427% and an ammonium polyacrylate concentration of 1.02%.

This additive liquid N and an abrasive particle mixture A prepared in the same manner as in Example 1 in a mass ratio of 1:1 were mixed with stirring to prepare a polishing compound having an abrasive particle concentration of 1%, a concentration of the ammonium polyacrylate from the abrasive particle mixture A of 0.007%, a concentration of the ammonium polyacrylate from the additive liquid N of 0.51% and a pH of 5.0.

With respect to the above respective Examples, the composition of the polishing compound, the pH, the average particle size of the abrasive particles and the coagulation and sedimentation time of the polishing compound are shown in Table 1, and the results of evaluation of the polishing properties are shown in Table 2. The polishing properties in Examples 6, 7 and 13 were evaluated only with respect to the blanket wafer of a BPSG film. The polishing properties in Examples 9 and 10 were evaluated only with respect to the patterned wafer of a BPSG film.

In Examples 1 to 12, in both abrasive particle mixture A and polishing compound, the average particle size of the abrasive particles was 0.19 μm. That is, coagulation of the abrasive particles did not proceed by mixing with the additive liquids B to M. The polishing compounds were left at rest to evaluate the dispersion stability and as a result, coagulation and sedimentation did not occur and the dispersed state was maintained over one week. The dispersed state was at the same level as the abrasive particle mixture A to which no additive was added, and even after the polishing compounds were left at rest for ten days by the above method of evaluating the dispersion stability, no supernatant fluid appeared, thus indicating excellent dispersibility. However, in the polishing compound in Example 13, sedimentation by coagulation of the abrasive particles occurred within several tens minutes.

Further, the polishing properties of the polishing compounds prepared in the above Examples were evaluated and as a result, with respect to the polishing properties of the polishing compounds in Examples 1 to 4, 8 and 11 against the blanket wafer, the polishing rate ($O_x$) of the BPSG film having boron and phosphorus concentrations of 3.52% and 3.85%, respectively, was 53 nm/minute with the polishing compound in Example 1, 23 nm/minute with the polishing compound in Example 2, 21 nm/minute with the polishing compound in Example 3, 17 nm/minute with the polishing compound in Example 4, 30 nm/minute with the polishing compound in Example 8, and 15 nm/minute with the polishing compound in Example 11.

Further, with the polishing compound in Example 1, the patterned wafer polishing time was 120 seconds, the variation of the thickness at the protruded portion was 48 nm, the maximum polishing amount at the recessed portion was 190 nm, and the maximum difference in level was 3 nm. With the polishing compound in Example 2, the patterned wafer polishing time was 150 seconds, the variation of the thickness at the protruded portion was 25 nm, the maximum polishing amount at the recessed portion was 120 nm, and the maximum difference in level was 1 nm. With the polishing compound in Example 3, the patterned wafer polishing time was 150 seconds, the variation of the thickness at the protruded portion was 20 nm, the maximum polishing amount at the recessed portion was 100 nm, and the maximum difference in level was 5 nm. With the polishing compound in Example 4, the patterned wafer polishing time was 180 seconds, the variation of the thickness at the protruded portion was 11 nm, the maximum polishing amount at the recessed portion was 100 nm, and the maximum difference in level was 3 nm.

With respect to the properties of the polishing compounds in Examples 5 and 6 over the blanket wafer, the polishing rate ($O_x$) of the BPSG film having boron and phosphorus concentrations of 13% and 14%, respectively, was 60 nm/minute with the polishing compound in Example 5 and 33 nm/minute with the polishing compound in Example 6. Further, the patterned wafer polishing time was 120 seconds with the polishing compound in Example 5, the variation of the thickness at the protruded portion was 10 nm, the maximum polishing amount at the recessed portion was 90 nm, and the maximum difference in level was 25 nm.

With respect to the polishing properties of the polishing compounds in Example 7 over the blanket wafer, the polishing rate ($O_x$) of the BPSG film having boron and phosphorus concentrations of 13% and 14%, respectively, was 3 nm/minute.

Further, with the polishing compounds in Example 8, the patterned wafer polishing time was 180 seconds, the variation of the thickness at the protruded portion was 7 nm, the maximum polishing amount at the recessed portion was 80 nm, and the maximum difference in level was 2 nm. With the polishing compounds in Example 9, the patterned wafer polishing time was 150 seconds, the variation of the thickness at the protruded portion was 26 nm, the maximum polishing amount at the recessed portion was 110 nm, and the maximum difference in level was 1 nm. With the polishing compounds in Example 10, the patterned wafer polishing time was 180 seconds, the variation of the thickness at the protruded portion was 19 nm, the maximum polishing amount at the recessed portion was 108 nm, and the maximum difference in level was 4 nm. With the polishing compound in Example 11, the patterned wafer polishing time was 210 seconds, the variation of the thickness at the protruded portion was 17 nm, the maximum polishing amount at the recessed portion was 71 nm, and the maximum difference in level was 13 nm.

The polishing rate ($O_x$) of the blanket wafer of a BPSG film having boron and phosphorus concentrations of 13% and 14%, respectively, with the polishing compounds in Examples 12 and 13, was 595 nm/minute in Example 12 and 551 nm/minute in Example 13. Further, the polishing rate ($O_x$) of the blanket wafer of a BPSG film having boron and phosphorus concentrations of 3.52% and 3.85%, respectively, was 330 nm/minute in Example 12 and 306 nm/minute in Example 13. With the polishing compound in Example 12, the patterned wafer polishing time was 60 seconds, the variation of the thickness at the protruded portion was 93 nm, the maximum polishing amount at the recessed portion was 286 nm, and the maximum difference in level was 5 nm.

From the results of the polishing properties over the blanket wafer, it is understood that the polishing rate of the BPSG film is sufficiently suppressed with the polishing compounds in Examples 1 to 11 which are Examples of the present invention, as compared with the polishing compounds in Examples 12 and 13 which are Comparative Examples. Further, from the results of the polishing properties over the patterned wafer, it is understood that with the polishing compound in Example 12, the difference in level is eliminated with a polishing time of 60 seconds, but the variation of the thickness at the protruded portion is significant and the polishing amount at the recessed portion is excessively large, whereas with the polishing compounds in Examples 1 to 5 and 8 to 11 which are Examples of the present invention, the difference in level is eliminated with polishing times of from 120 seconds to 210 seconds, the variation of the thickness at the protruded portion is small, and the polishing amount at the recessed portion is very small. With the polishing compound in Example 11, the maximum difference in level is slightly large as compared with the other polishing compounds, but the maximum polishing amount at the recessed portion is most suppressed among Examples 1 to 5 and 8 to 11, and favorable results were obtained.

TABLE 1

| Ex. | Abrasive particles Concentration (%) | Abrasive particles Particle size (μm) | Concentration of dispersant (%) | Additive from additive liquid Type | Additive from additive liquid Molecular weight | Additive from additive liquid Concentration (%) | pH | Coagulation sedimentation time |
|---|---|---|---|---|---|---|---|---|
| 1 | 1.0 | 0.19 | 0.007 | Polyoxypropylene diamine | 230 | 0.5 | 10.8 | More than one week |
| 2 | 1.0 | 0.19 | 0.007 | Polyoxypropylene diamine | 230 | 1.0 | 11.2 | More than one week |
| 3 | 1.0 | 0.19 | 0.007 | Polyoxypropylene diamine | 230 | 1.25 | 11.3 | More than one week |
| 4 | 1.0 | 0.19 | 0.007 | Polyoxypropylene diamine | 230 | 1.5 | 11.4 | More than one week |
| 5 | 1.0 | 0.19 | 0.007 | Polyoxypropylene diamine | 400 | 0.5 | 10.9 | More than one week |
| 6 | 1.0 | 0.19 | 0.007 | Polyoxypropylene diamine | 400 | 1.0 | 11.1 | More than one week |
| 7 | 1.0 | 0.19 | 0.007 | Polyoxypropylene diamine | 440 | 0.5 | 10.9 | More than one week |
| 8 | 1.0 | 0.19 | 0.007 | 4,7,10-trioxa-tridecane-1,13-diamine | 220 | 0.25 | 10.7 | More than one week |
| 9 | 1.0 | 0.19 | 0.007 | 4,7,10-trioxa-tridecane-1,13-diamine | 220 | 0.15 | 10.6 | More than one week |
| 10 | 1.0 | 0.19 | 0.007 | N,N'-bis(3-aminopropyl)-ethylenediamine | 220 | 0.20 | 11.3 | More than one week |

TABLE 1-continued

| | Abrasive particles | | Concentration of dispersant (%) | Additive from additive liquid | | | | Coagulation sedimentation time |
|---|---|---|---|---|---|---|---|---|
| Ex. | Concentration (%) | Particle size (μm) | | Type | Molecular weight | Concentration (%) | pH | |
| 11 | 1.0 | 0.19 | 0.007 | Pentaethylene-hexamine | 232 | 0.1 | 11.2 | More than one week |
| 12 | 1.0 | 0.19 | 0.007 | Ammonium polyacrylate | 5,000 | 0.34 | 5.0 | More than one week |
| 13 | 1.0 | 0.29 | 0.007 | Ammonium polyacrylate | 5,000 | 0.51 | 5.0 | Less than several tens minutes |

TABLE 2

| Ex. | Polishing rate of BPSG film 1 (nm/minute) | Polishing rate of BPSG film 2 (nm/minute) | Patterned wafer polishing time (sec) | Variation of thickness at protruded portion (nm) | Maximum polishing amount at recessed portion (nm) | Maximum difference in level (nm) |
|---|---|---|---|---|---|---|
| 1 | 53 | — | 120 | 48 | 190 | 3 |
| 2 | 23 | — | 150 | 25 | 120 | 1 |
| 3 | 21 | — | 150 | 20 | 100 | 5 |
| 4 | 17 | — | 180 | 11 | 100 | 3 |
| 5 | — | 60 | 120 | 10 | 90 | 5 |
| 6 | — | 33 | — | — | — | — |
| 7 | — | 3 | — | — | — | — |
| 8 | 30 | — | 180 | 7 | 80 | 2 |
| 9 | — | — | 150 | 26 | 110 | 1 |
| 10 | — | — | 180 | 19 | 108 | 4 |
| 11 | 15 | — | 210 | 17 | 71 | 13 |
| 12 | 330 | 595 | 60 | 93 | 286 | 5 |
| 13 | 306 | 551 | — | — | — | — |

BPSG film 1: Boron and phosphorus concentrations of 3.52% and 3.85%, respectively.
BPSG film 2: Boron and phosphorus concentrations of 13% and 14%, respectively.

Example 14

Using the same polishing compound as in Example 1, the polishing properties over a silicon dioxide film were evaluated. As a result, the patterned wafer polishing time was 180 seconds, the variation of the thickness at the protruded portion was 33 nm, the maximum polishing amount at the recessed portion was 84 nm, and the maximum difference in level was 11 nm.

From the above results, with the polishing compound in Example 14 which is an Example of the present invention, the difference in level was eliminated with a polishing time at the same level as in Examples 1 to 5 and 8 to 11, the variation of the thickness at the protruded portion was small, and the polishing amount at the recessed portion was suppressed. Therefore, it is understood that the present invention is useful also when the plane to be polished is a plane of a silicon dioxide layer.

INDUSTRIAL APPLICABILITY

The present invention is suitably used for a semiconductor device employing ILD, STI and PMD.

The entire disclosure of Japanese Patent Application No. 2005-092608 filed on Mar. 28, 2005 including specification, claims, drawings and summary is incorporated herein by reference in its entirety.

What is claimed is:

1. A polishing composition for chemical mechanical polishing a plane of a silicon dioxide type material layer to be polished in production of a semiconductor integrated circuit device, wherein the polishing composition has a pH of from 9 to 12 and comprises:
   cerium oxide particles having an average particle size from 0.01 to 0.5 μm;
   a water-soluble polyamine having a weight average molecular weight from 100 to 100,000 selected from the group consisting of water-soluble polyether polyamine, water-soluble polyalkylene polyamine, water-soluble polyethyleneimine, water-soluble polyvinylamine, water-soluble polyallylamine, water-soluble polylysine and water-soluble chitosan; and
   water.

2. The polishing composition according to claim 1, wherein the silicon dioxide type material layer is a borophosphosilicate glass (BPSG) layer, a borosilicate glass (BSG) layer or a phosphosilicate glass (PSG) layer.

3. The polishing composition according to claim 1, wherein the concentration of phosphorus, boron, or phosphorus and boron, in the silicon dioxide type material layer, is from 0.1 to 20 mass %.

4. The polishing composition according to claim 1, wherein the silicon dioxide type material layer is a silicon dioxide layer.

5. The polishing composition according to claim 1, wherein the water-soluble polyamine is at least one water-soluble polyamine selected from the group consisting of a water-soluble polyether polyamine and a water-soluble polyalkylene polyamine.

6. The polishing composition according to claim 1, wherein the water-soluble polyamine has a weight average molecular weight of from 100 to 2,000.

7. The polishing composition according to claim 1, wherein the water-soluble polyamine has a weight average molecular weight of from 150 to 800.

8. The polishing composition according to claim 1, which contains the water-soluble polyamine in an amount of from 0.001 to 20 mass % based on the total mass of the polishing composition.

9. The polishing composition according to claim 1, which contains the water-soluble polyamine in an amount of from 0.05 to 5 mass % based on the total mass of the polishing composition.

10. The polishing composition according to claim 1, wherein the water-soluble polyamine has a weight average molecular weight of from 150 to 400.

11. A method for polishing a plane to be polished, which comprises supplying a polishing compound to a polishing pad, and bringing a plane to be polished of a semiconductor integrated circuit device and the polishing pad into contact with each other to polish the plane to be polished by relative movement between them, wherein the plane to be polished is a plane to be polished of a silicon dioxide type material layer, and the polishing compound as defined in claim 1 is used as the polishing compound.

12. A method for producing a semiconductor integrated circuit device, which comprises a step of polishing a plane to be polished by the polishing method as defined in claim 11.

13. The polishing composition according to claim 1, wherein the cerium oxide particles have an average particle size of 0.02 to 0.3 µm.

14. The polishing composition according to claim 1, wherein the cerium oxide particles have an average particle size of 0.05 to 0.2 µm.

15. The polishing composition according to claim 1, wherein the silicon dioxide type material layer is a phosphosilicate glass (PSG) layer.

16. The polishing composition according to claim 1, wherein the silicon dioxide material layer is a borophosphosilicate glass (BPSG) layer.

17. The polishing composition according to claim 1, wherein the water-soluble polyamine is a water-soluble polyether diamine or water-soluble polyalkylene polyamine represented by the following general formula (1):

$$H_2N-(R-X)_k-R-NH_2 \qquad (1)$$

wherein each R is independently a $C_2$-$C_8$ alkylene group, X is an oxygen atom or an —NH— group, and k is either an integer of at least 2 when X is an oxygen atom or an integer of at least 1 when X is an —NH— group.

18. The polishing composition according to claim 1, wherein the water-soluble polyamine is a water-soluble polyether diamine represented by the following general formula (2):

$$H_2N-R^2-O-(R^1-O)_m-R^2-NH_2 \qquad (2)$$

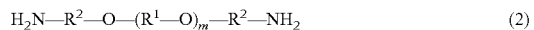

wherein each $R^1$ is independently an ethylene group or a propylene group, each $R^2$ is independently a $C_2$-$C_6$ alkylene group, and m is an integer of at least 2.

19. The polishing composition according to claim 18, wherein the water-soluble polyether diamine according to general formula (2) is selected from the group consisting of polyoxyethylene diamine, polyoxypropylene diamine and 4,7,10-trioxamidecane-1,13-diamine.

20. The polishing composition according to claim 1, wherein the water-soluble polyamine is a water-soluble polyalkylene polyamine represented by the following general formula (3):

$$H_2N-R^4-NH-(R^3-NH)_n-R^4-NH_2 \qquad (3)$$

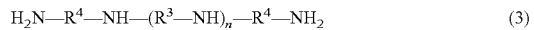

wherein each $R^3$ is independently a $C_2$-$C_6$ alkylene group, each $R^4$ is independently a $C_2$-$C_8$ alkylene group, and n is an integer of at least 1.

21. The polishing composition according to claim 20, wherein the water-soluble polyalkylene polyamine according to general formula (3) is selected from the group consisting of tetraethylenepentamine, pentaethylenehexamine, heptaethyleneoctamine, N,N'-bis(3-aminopropyl)-ethylenediamine and N,N'-bis(2-aminoethyl)-1,4-butanediamine.

* * * * *